United States Patent
Vetter et al.

(10) Patent No.: US 8,165,841 B2
(45) Date of Patent: Apr. 24, 2012

(54) INTELLIGENT ELECTRONIC DEVICE CONFIGURATION INSPECTION

(75) Inventors: Claus Vetter, Buchs (CH); Stephan Gerspach, Herrischried (DE); Tetsuji Maeda, Baar (CH)

(73) Assignee: ABB Research Ltd, Zurich (CH)

( * ) Notice: Subject to any disclaimer, the term of this patent is extended or adjusted under 35 U.S.C. 154(b) by 231 days.

(21) Appl. No.: 12/256,980

(22) Filed: Oct. 23, 2008

(65) Prior Publication Data

US 2009/0076762 A1    Mar. 19, 2009

Related U.S. Application Data

(63) Continuation of application No. PCT/EP2007/053894, filed on Apr. 20, 2007.

(30) Foreign Application Priority Data

Apr. 24, 2006   (EP) .................................. 06405174

(51) Int. Cl.
 *G06F 19/00*  (2011.01)
(52) U.S. Cl. ........................ 702/122; 719/313
(58) Field of Classification Search .................. 702/122, 702/123, 185; 370/252, 503; 719/313
See application file for complete search history.

(56) References Cited

U.S. PATENT DOCUMENTS

| | | | |
|---|---|---|---|
| 6,970,771 B1 | 11/2005 | Preiss et al. | |
| 2002/0173927 A1 | 11/2002 | Vandiver | |
| 2008/0127210 A1* | 5/2008 | Bosold et al. | 719/313 |

FOREIGN PATENT DOCUMENTS

| | | |
|---|---|---|
| EP | 1 096 348 | 5/2001 |
| EP | 1 102 167 | 5/2001 |

OTHER PUBLICATIONS

Form PCT/ISA/210 (International Search Report) dated Jul. 23, 2007.
Form PCT/ISA/237 (Written Opinion of the International Searching Authority) dated Jul. 23, 2007.
European Search Report dated Sep. 11, 2006.
"IEEE P1615/D2—Draft Recommended Practice for Network Communication in Electric Power Substations", C3TFI Working Group, Jan. 2006, the whole book, XP-002395536.
F. Crispino et al., "An Experiment Using an Object-Oriented Standard—IEC 61850 to Integrate IEDs Systems in Substations", 2004 IEEE/PES Transmission & Distribution Conference & Exposition: Latin America, Nov. 8-11, 2004, pp. 22-27, XP-010799829.
Wolfgang Wimmer, "IEC 61850 SCL—More Than Interoperable Data Exchange Between Engineering Tools", International Electrotechnical Committee, Geneva, Communication Networks and Systems in Substations, 5 pages, Aug. 22-26, 2005.
International Preliminary Report on Patentability issued Oct. 28, 2008 in corresponding International Patent Application No. PCT/EP2007/053894.

* cited by examiner

*Primary Examiner* — John H Le
(74) *Attorney, Agent, or Firm* — Buchanan Ingersoll & Rooney PC

(57) ABSTRACT

The present disclosure is concerned with a Substation Automation testing tool which combines the information found in the SCL (Substation Configuration Language) File of a substation (Substation Configuration Description) or an IED (IED Capability description) with substation-relevant data extracted from the Substation Communication network traffic. Using a message interceptor, e.g., a laptop computer, connected to a substation communication network, IEC 61850 relevant data is retrieved and analyzed. Hence, consistency verification without revision handling and a reduction of the time and efforts for commissioning or testing a substation installation are possible.

10 Claims, 2 Drawing Sheets

Fig. 3

- GOOSE
  - ReferencedGoCB: null
  - GoCBRef: AA1D1Q10A1LD0/LLN0$gcb_A
  - DataSetRef: AA1D1Q10A1LD0/LLN0$InterlockingA
  - TimeAllowedToLive: 11000
  - Timestamp: 20.10.2005 16:05:05
  - StateChangeNumber: 43
  - SequenceNumber: 0
  - TestMode: False
  - ConfigurationRevision: 2
  - MatchesSCDConfiguration: true
  - NeedsCommissioning: False
- DataSet
  - DataSetMissing_0 : True
  - DataSetMissing_1 : False
  - DataSetMissing_2 : False
  - DataSetMissing_3 : False
  - DataSetMissing_4 : False
  - DataSetMissing_5 : 0000000000000000
  - DataSetMissing_6 : 01
  - DataSetMissing_7 : 0000000000000000
  - DataSetMissing_8 : 01
  - DataSetMissing_9 : 0000000000000000
  - DataSetMissing_10 : 01
  - DataSetMissing_11 : 0000000000000000
  - DataSetMissing_12 : 01
  - DataSetMissing_13 : 0000000000000000
  - DataSetMissing_14 : 01
  - DataSetMissing_15 : 0000000000000000
  - DataSetMissing_16 : 01
  - DataSetMissing_17 : 0000000000000000
  - DataSetMissing_18 : 10
  - DataSetMissing_19 : 0000000000000000
  - DataSetMissing_20 : 10

Fig. 4

- GOOSE
  - ReferencedGoCB: ABB.IEC61850.GenericObjects.G_GoCB gcb_A
  - GoCBRef: AA1D1Q10A1LD0/LLN0$gcb_A
  - DataSetRef: AA1D1Q10A1LD0/LLN0$InterlockingA
  - TimeAllowedToLive: 11000
  - Timestamp: 20.10.2005 16:05:05
  - StateChangeNumber: 43
  - SequenceNumber: 0
  - TestMode: False
  - ConfigurationRevision: 2
  - MatchesSCDConfiguration: true
  - NeedsCommissioning: False
- DataSet
  - [ST] AA1D1Q10A1C1/QA1_1CSWI1.Pos.stSeld : True  ⎫
  - [ST] AA1D1Q10A1C1/QC2_4CSWI5.Pos.stSeld : False ⎬ A
  - [ST] AA1D1Q10A1C1/QB2_2CSWI3.Pos.stSeld : False ⎭
  - [ST] AA1D1Q10A1C1/QB1_1CSWI2.Pos.stSeld : False ⎫
  - [ST] AA1D1Q10A1C1/QC1_3CSWI4.Pos.stSeld : False ⎬ B
  - [ST] AA1D1Q10A1C1/QA1_1XCBR1.Pos.q : 0000000000000000
  - [ST] AA1D1Q10A1C1/QA1_1XCBR1.Pos.stVal : 01
  - [ST] AA1D1Q10A1C1/QA1_1XCBR4.Pos.q : 0000000000000000
  - [ST] AA1D1Q10A1C1/QA1_1XCBR4.Pos.stVal : 01
  - [ST] AA1D1Q10A1C1/QA1_1XCBR3.Pos.q : 0000000000000000
  - [ST] AA1D1Q10A1C1/QA1_1XCBR3.Pos.stVal : 01
  - [ST] AA1D1Q10A1C1/QA1_1XCBR2.Pos.q : 0000000000000000
  - [ST] AA1D1Q10A1C1/QA1_1XCBR2.Pos.stVal : 01
  - [ST] AA1D1Q10A1C1/QC1_3XSWI4.Pos.q : 0000000000000000
  - [ST] AA1D1Q10A1C1/QC1_3XSWI4.Pos.stVal : 01
  - [ST] AA1D1Q10A1C1/QC2_4XSWI2.Pos.q : 0000000000000000
  - [ST] AA1D1Q10A1C1/QC2_4XSWI2.Pos.stVal : 01
  - [ST] AA1D1Q10A1C1/QB2_2XSWI3.Pos.q : 0000000000000000
  - [ST] AA1D1Q10A1C1/QB2_2XSWI3.Pos.stVal : 01
  - [ST] AA1D1Q10A1C1/QB1_1XSWI1.Pos.q : 0000000000000000
  - [ST] AA1D1Q10A1C1/QB1_1XSWI1.Pos.stVal : 10

INTELLIGENT ELECTRONIC DEVICE CONFIGURATION INSPECTION

RELATED APPLICATIONS

This application claims priority under 35 U.S.C. §119 to EP Application 06405174.1 filed in Europe on Apr. 24, 2006, and as a continuation application under 35 U.S.C. §120 to PCT/EP2007/053894 filed as an International Application on Apr. 20, 2007 designating the U.S., the entire contents of which are hereby incorporated by reference in their entireties.

TECHNICAL FIELD

The disclosure relates to the field of Substation Automation systems with a standardized configuration representation. More particularly, it relates to a method of inspecting the configuration of a Intelligent Electronic Device in the SA system

BACKGROUND INFORMATION

Substations for power distribution in high and medium voltage power networks include primary or field devices such as electrical cables, lines, bus bars, switches, breakers, power transformers and instrument transformers arranged in switch yards and/or bays. These primary devices are operated in an automated way via a Substation Automation (SA) system responsible for controlling, protecting and monitoring of substations. The SA system comprises programmable secondary devices, so-called Intelligent Electronic Devices (IED), interconnected in a SA communication network, and interacting with the primary devices via a process interface. The IEDs are generally assigned to one of three hierarchical levels, namely the station level with the operators place including a Human-Machine Interface (HMI) as well as the gateway to the Network Control Centre (NCC), the bay level with its bay units for protection and control, and the process level. Process level units comprise e.g. electronic sensors for voltage, current and gas density measurements as well as contact probes for sensing switch and transformer tap changer positions, or breaker-IEDs controlling an actuator or drive of a circuit breaker or disconnector. Intelligent actuators or breaker-IEDs may be integrated in the respective intelligent primary equipment and connected to a bay unit via a serial link or optical process bus. The bay units are connected to each other and to the IEDs on the station level via an inter-bay or station bus.

Today's SA systems require interoperability between all substation devices independent of the manufacturer. Therefore, an internationally accepted communication standard for communication between the IEDs of a substation has been introduced. The IEC standard 61850 "communication networks and systems in substations" decouples the substation-specific application functionality from the substation communication-specific issues and to this end, defines an abstract object model for compliant substations, and a method how to access these objects over a network via an Abstract Communication Service Interface (ACSI). This allows the substation-specific applications such as the Operator Work Station (OWS) to operate with standard objects, while the actual IED-specific objects in the substation may be realized differently by the manufacturers of the IEDs. An abstract data model according to the standard incorporates SA functionality in terms of logical nodes grouped into logical devices and allocated to the IEDs as the physical devices. The communication-specific issues are handled via an ISO/OSI communication stack presently comprising a stack with MMS/TCP/IP/Ethernet and an optical physical layer. While the data model including attributes like time stamps or validity indications is realized by the application layer of the communication stack, messages for time-critical or safety-related communication, i.e. the Generic Object Oriented Substation Events (GOOSE) such as trips and blockings, as well as for analogue sampled values, are mapped directly to the Ethernet link layer of the communication stack.

One impact of the aforementioned interoperability requirement is that devices from different suppliers have to be combined into one SA system by the system integrator, and engineering data has to be exchanged between dedicated engineering or SA configuration tools of different suppliers during the commissioning process. Therefore, the complete system with its entire devices and communication links has to be described in a formal way in the engineering process. This is enabled by the comprehensive XML-based Substation Configuration description Language (SCL) for IEC 61850 compliant systems that is part of the standard.

The SCL language is used to describe the capabilities of a particular IED or IED type in an IED Capability Description (ICD). It enumerates the communication and application functionality of the physical device as delimited e.g. by the number of I/O ports. A Substation Configuration Description (SCD) file in SCL language describes a model of a particular substation, the IED functions in terms of logical nodes, and the communication connections. The SCD file comprises (1) a switch yard naming and topology description, (2) IED configuration description (functions in terms of logical nodes), (3) Relation between switch yard and IED functions, (4) communication network description. Accordingly, if a particular IED is used within an SA system, then based on its ICD type description an object instance of the IED is inserted into the corresponding SCD file. The SCL language then allows specifying typical or individual values for data attributes carried by the instance and related to the particular IED, e.g. values for configuration attributes and setting parameters. The connection between the power process and the SA system is described in the SCL language by attaching logical nodes to elements of the primary equipment. Typically, a switch control logical node is attached to a switching device, whereas a measurement logical node or a protection function logical node is allocated to a bay unit.

In a substation engineering process, the SA configuration (topology, IED configuration and communication setup) is derived from the customer requirements and stored in an SCD file. For the actual installation or commissioning, all or parts of the configuration information previously engineered needs to be transferred to the physical devices, and the IEDs themselves need to be configured properly. As an SA system is a distributed system, this occurs sequentially, i.e. one IED after the other is loaded with substation-specific configuration data from the SCD file and put into operation. Furthermore, different IEDs might be loaded individually by different suppliers with their own proprietary tools. Part of this process is automated but most steps still require human interaction by commissioning or test engineers. All these activities are error-prone. Additional sources of inconsistency between the SCD file and the actual configuration of an individual IED arise from different versions of the SCL file used, or from the fact that IEDs allow their configuration to be changed locally, i.e. on the device itself.

As detailed above, the configuration as initially engineered and stored in the corresponding SCL files and the configuration found on the physical devices, i.e. the proper configuration of the device functions and/or allocation of logical nodes to the IED, may differ. Such inconsistencies may manifest themselves during or after a commissioning of an SA system. A test and commissioning engineer is then confronted with the following symptoms: no communication between two devices is occurring, or the data (according to a certain protocol) is incorrect or missing, and may seek to identify the IED being badly configured. On the other hand, and despite the fact that testing cannot guarantee the absence of errors in complex situations, the goal of the same engineer is to demonstrate the correct coordinated working of all parts in the most likely and important (intended) application scenarios.

In order to guarantee interoperability according to the global standard IEC 61850, to minimize the risk for system integration, and to assure correct working of a distributed SA system at start-up as well as during configuration changes, IEC 61850 has introduced a concept of configuration revision information for the abstract data model and the communication related definitions. This information can, and in the case of safety-related real time services like GSE (Generic Substation Event) and sampled values has, to be checked at the receiver to assure that his assumptions about message contents are consistent with the actual configuration state of the sender. The information about the revision actually used is available on-line, for real-time services even in each telegram sent. The receiver detects a revision mismatch by comparing the on-line revision information with its configuration based expected revision information, concludes on a change of sender data model, data set layout or communication definitions, and takes appropriate measures.

In the article by Wolfgang Wimmer entitled "IEC 61850—more than interoperable data exchange between engineering tools", presented at the PSCC Conference in Liege, Aug. 22-26, 2005, any SCL file comprises version and revision handling related information. A file header contains a document reference and a version/revision history for tracking of changes such as different versions of IED capability descriptions. However, such information may itself get lost while configuring IEDs, or updating information may inadvertently be ignored.

The patent application US 2002/0173927 relates to the testing of protection and control Intelligent Electronic Devices (IEDs) based on a data exchange using digital communication between the test system and the IED being tested. A test device (virtual IED) provides analogue currents and voltage waveforms over analogue signal lines to simulate the secondary currents and voltages seen by the IED under test. In addition, data packets containing status information related to the status of primary or secondary substation equipment during the simulated power system fault are sent to the IED over the communication link. The focus is on testing, i.e. a verification of the proper working of the configured device functions or allocated logical nodes, i.e. the verification of the expected correct action as triggered by the test device's output. However, the aforementioned patent application does not question the configuration of the IED under test, i.e. the proper configuration of the device functions and/or allocation of logical nodes to the IED.

With the growing dependency on Ethernet communication between IEDs and other devices in a substation, tools have been developed that allow for analysis of the network traffic, i.e. basic Ethernet and e.g., related TCP/IP traffic, being exchanged in a SA network. A few of these (mms-ethereal, KEMA Analyzer) allow to further analyse standard Ethernet traffic and extract 61850 relevant data packets such as Sampled values, GOOSE, MMS etc. from the messages. However, there is no possibility for an operator to understand the context of this extracted data, i.e. to give it a correct meaning. This is even truer if said data is in binary format (sequence of bits).

SUMMARY

The disclosure relates to avoiding the difficulties arising from the abovementioned sources of error or inconsistency. A method of and a message interceptor for inspecting the configuration of an Intelligent Electronic Device in a Substation Automation system are variously disclosed.

A method of inspecting the configuration of an Intelligent Electronic Device (IED) in a Substation Automation (SA) system is disclosed, wherein configuration information about the SA system and about the IED is contained respectively in a Substation Configuration Description (SCD) or an IED Capability Description (ICD), and wherein the IED sends messages over an SA communication network, comprising intercepting a message sent by the IED over the SA communication network and extracting standardized substation-specific data from the message, wherein the method comprises analyzing the extracted data by means of the configuration information about the SA system or about the IED.

A message interceptor for inspecting the configuration of an Intelligent Electronic Device (IED) in a Substation Automation (SA) system is disclosed, wherein configuration information about the SA system and about the IED is contained respectively in a Substation Configuration Description (SCD) or an IED Capability Description (ICD), and wherein the IED sends messages over an SA communication network, comprising means for intercepting a message sent by the IED over the SA communication network and extracting standardized substation-specific data from the message, means for analyzing the extracted data by means of the configuration information about the SA system or about the IED.

In another aspect, a substation automation system capable of inspecting the configuration of an intelligent electronic device of the system is disclosed. Such a substation automation system comprises a substation configuration description which includes configuration information about the substation automation system; an intelligent electronic device capability description which includes configuration information about the intelligent electronic device; and a substation automation communication network, wherein the intelligent electronic device sends a message over the substation automation communication network, wherein the message sent by the intelligent electronic device over the substation automation communication network is intercepted to extract standardized substation-specific data from the message, and wherein the extracted data is analyzed based on the configuration information about the substation automation system or about the intelligent electronic device.

BRIEF DESCRIPTION OF THE DRAWINGS

The subject matter of the disclosure will be explained in more detail in the following text with reference to exemplary embodiments which are illustrated in the attached drawings, wherein:

FIG. 3 shows raw information extracted from an exemplary intercepted message, and FIG. 4 shows enhanced exemplary information generated for display to an end-user.

DETAILED DESCRIPTION

The disclosure describes an exemplary Substation Automation testing tool which combines the information found in the SCL (Substation Configuration Language) File of a substation (Substation Configuration Description) or an IED (IED Capability description) with substation-relevant data extracted from the Substation Communication network traffic. By means of a standard laptop computer as a message interceptor connected to a substation communication network, IEC 61850 relevant data is retrieved and analysed. Hence, the disclosure allows for consistency verification without revision handling and achieves a reduction of the time and efforts for commissioning or testing a substation installation.

Figure 1:
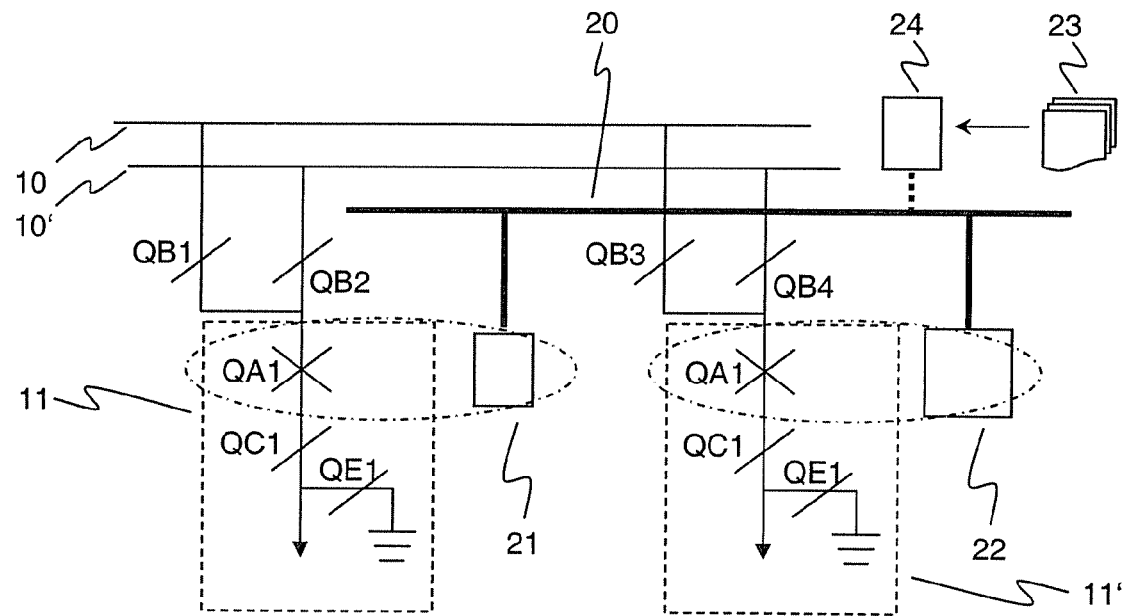
FIG. 1 shows an exemplary single line diagram of a substation.

FIG. 1 shows an exemplary single line diagram of a part or section of an exemplary substation at an assumed voltage level of e.g. 110 kV, together with some communication links and SA or secondary equipment. The model of a switch yard at single line level contains the topological respectively electrical connections between primary equipment. The substation comprises a double bus bar configuration with two bus bars 10, 10', each of them feeding two bays 11, 11' via disconnectors QB1 to QB4. Each bay comprises a circuit breaker QA1, a disconnector QC1 and an earthing switch QE1. The corresponding excerpt of the SA system depicts, in bold lines, a communication network 20 connected to two IEDs 21, 22, which both host logical nodes of class CSWI (switch control). Each logical node is allocated to one of the aforementioned circuit breakers QA1 as indicated by the dash-dot lines. Substation specific SCL files 23 comprise a Substation Configuration Description (SCD) of the substation including IEDs 21, 22, or an IED Capability Description (ICD) of a first IED 21.

Figure 2:
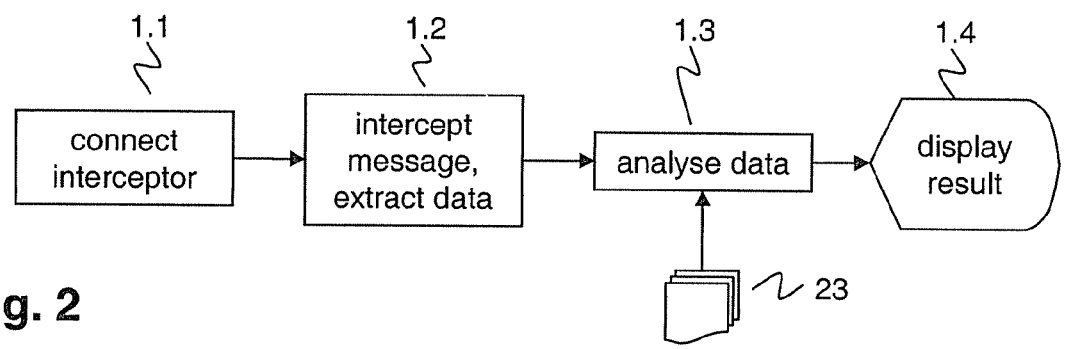
FIG. 2 is a flowchart of an exemplary embodiment of the process.

FIG. 2 depicts a flowchart of an exemplary embodiment of the process comprising the following steps.

In step 1.1, e.g. during commissioning of the substation, a laptop computer as a message interceptor 24 is connected to the SA communication network 20 or inter-bay bus at strategic locations. Suitable or strategic locations include the vicinity of the Ethernet switch of the corresponding bay comprising the IED 21, or the vicinity of an Operator Work Station where most of the network traffic converges.

In step 1.2, messages sent out by the first IED 21 to the second IED 22 as the intended recipient are intercepted by the interceptor 24. From the intercepted message, standardized substation-specific data, e.g. data relevant to the operation of the substation or data concerning the communication in the SA system, is extracted or filtered. In substations conformant to the standard IEC 61850, such data is easily recognisable in the network traffic, and tools to this purpose are readily available. However, in the absence of any further information, an important fraction of this extracted data can only be displayed in raw form. In FIG. 3, such extracted data from a particular network packet is displayed, wherein the term "DataSetMissing_#" stands for raw data that remains to be interpreted.

In step 1.3, the extracted, substation-relevant data is interpreted or analyzed with the help of substation configuration information as stored e.g. in Substation Configuration Description (SCD) and IED Capability Description (ICD) files 23. A corresponding excerpt of the SCL file 23 reads as follows:

```
<ConductingEquipment name="QA1" desc="Circuit Breaker" type="CBR" sxy:x="9" sxy:y="8" sxy:dir="vertical">
    <LNode iedName="AA1D1Q10A1" ldInst="C1" prefix="QA1_1" lnClass="GGIO" lnInst="2"/>
    <LNode iedName="AA1D1Q10A1" ldInst="C1" prefix="QA1_1" lnClass="CSWI" lnInst="1"/>
    <LNode iedName="AA1D1Q10A1" ldInst="C1" prefix="QA1_1" lnClass="XCBR" lnInst="1"/>
```

For the intended purpose of interpretation, said files are loaded into the interceptor 24 or interrogated by the latter. The analysis of the extracted data comprises an interpretation with the help of the description found in the SCD or ICD file, and generates enhanced information about the IED 21. Such information relates e.g. to the specific data type or format of a piece of data extracted, i.e. whether a particular number is represented in Integer, String or hexadecimal format. The information may also reveal the semantical meaning of the number and indicate e.g. a switch position or any other attribute that has to be known or set for a proper operation of the substation automation system.

The relevant information is displayed in FIG. 4 for the same network packet as above in FIG. 3. Those lines with previously missing information about the dataset can now be interpreted correctly. By way of example, the interpreted lines A and B both refer to a first instance "1" of a logical node of class "XCBR" (circuit breaker) in a logical device instance "C1" with prefix "QA1_1" on IED "AA1D1Q10A1". On line A, "Pos.q" indicates a quality such as good (coded as "000000000") or bad. On line B, "Pos.stVal" indicates a status of the circuit breaker such as open (coded as "01"), close or intermediate.

Ultimately, in step 1.4, the interceptor 24 displays to the end-user, i.e. testing, engineering or commissioning personnel, as well as R&D engineers concerned with substation automation systems, the enhanced information generated previously and showing a combination of SCD/ICD information and data found in the IEC 61850 packets as depicted in FIG. 4.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF DESIGNATIONS 10 bus bar
11 bay
20 communication network
21 first Intelligent Electronic Device (IED)
22 second IED
23 SCL file
24 interceptor/analyzer

What is claimed is:

1. A method of inspecting a configuration of an Intelligent Electronic Device (IED) in a Substation Automation system, wherein configuration information about the Substation Automation system and about the IED is contained respectively in a Substation Configuration Description (SCD) or an IED Capability Description (ICD), and wherein the IED sends messages over a Substation Automation communication network to an intended recipient IED, the method comprising:

intercepting, by a message interceptor, a message sent by the IED over the Substation Automation communication network and extracting standardized substation-specific data from the message; and analyzing the extracted data based on said configuration information about at least one of the Substation Automation system and the IED to inspect the configuration of the IED;

wherein the standardized substation-specific data is data relevant to an operation of a substation or data concerning communications in the Substation Automation system.

2. The method according to claim 1, comprising displaying the analysed extracted data to an end-user.

3. The method according to claim 1, comprising connecting, at a strategic location, a message interceptor to the Substation Automation communication network for intercepting the message.

4. The method according to claim 3, wherein the standardized substation-specific data is described according to a standard IEC 61850.

5. The method according to claim 1, wherein the standardized substation-specific data is described according to a standard IEC 61850.

6. A message interceptor for inspecting a configuration of an Intelligent Electronic Device (IED) in a Substation Automation (SA) system, wherein configuration information about the Substation Automation system and about the IED is contained respectively in a Substation Configuration Description (SCD) or an IED Capability Description (ICD), and wherein the IED sends messages over a Substation Automation communication network to an intended recipient IED, the message interceptor comprising:

means for intercepting a message sent by the IED over a Substation Automation communication network to the intended recipient IED and extracting standardized substation-specific data from the message; and means for analyzing the extracted data based on the configuration information about at least one of the Substation Automation system and the IED to inspect a configuration of the IED;

wherein the standardized substation-specific data is data relevant to an operation of a substation or data concerning communications in the Substation Automation system.

7. The message interceptor according to claim 6, comprising means for displaying the analysed extracted data to an end-user.

8. A method of inspecting a configuration of an Intelligent Electronic Device (IED) in a Substation Automation system, wherein configuration information about the Substation Automation system and; about the IED is contained respectively in a Substation Configuration Description (SCD) or an IED Capability Description (ICD), and wherein the IED sends messages over a Substation Automation communication network to an intended recipient IED, the method comprising:

intercepting, by a message interceptor, a message sent by the IED over the Substation Automation communication network and extracting standardized substation-specific data from the message;

analyzing the extracted data based on said configuration information about at least one of the Substation Automation system and the IED to inspect the configuration of the IED; and connecting, at a strategic location, a message interceptor to the Substation Automation communication network for intercepting the message;

wherein the strategic location is one of an Ethernet switch of a bay comprising an IED and an Operator Work Station of the Substation Automation system.

9. The method according to claim 8, comprising displaying the analysed extracted data to an end-user.

10. The method according to claim 8, wherein the standardized substation-specific data is described according to a standard IEC 61850.

\* \* \* \* \*